(12) United States Patent (10) Patent No.: US 8,582,381 B2
Oowada et al. (45) Date of Patent: Nov. 12, 2013

(54) TEMPERATURE BASED COMPENSATION DURING VERIFY OPERATIONS FOR NON-VOLATILE STORAGE

(75) Inventors: Ken Oowada, Kanagawa (JP); Yingda Dong, San Jose, CA (US); Gerrit Jan Hemink, Yokohama (JP); Man Lung Mui, Santa Clara, CA (US); Hao Nguyen, San Jose, CA (US); Seungpil Lee, San Ramon, CA (US); Jong Park, Campbell, CA (US); Fanglin Zhang, Fremont, CA (US)

(73) Assignee: Sandisk Technologies, Inc., Plano, TX (US)

( * ) Notice: Subject to any disclaimer, the term of this patent is extended or adjusted under 35 U.S.C. 154(b) by 94 days.

(21) Appl. No.: 13/403,934

(22) Filed: Feb. 23, 2012

(65) Prior Publication Data

US 2013/0223155 A1 Aug. 29, 2013

(51) Int. Cl.
*G11C 7/04* (2006.01)
*G11C 11/34* (2006.01)
*G11C 16/04* (2006.01)
*G11C 16/06* (2006.01)

(52) U.S. Cl.
USPC ............... 365/211; 365/185.03; 365/185.21; 365/185.22

(58) Field of Classification Search
USPC .............. 365/185.03, 185.21, 185.22, 211
See application file for complete search history.

(56) References Cited

U.S. PATENT DOCUMENTS

| | | | |
|---|---|---|---|
| 6,888,758 B1 | 5/2005 | Hemink | |
| 7,002,843 B2 | 2/2006 | Guterman | |
| 7,020,026 B2 | 3/2006 | Guterman | |
| 7,057,958 B2 | 6/2006 | So | |
| 7,092,290 B2 | 8/2006 | Hemink | |
| 7,391,650 B2 | 6/2008 | Mokhlesi | |
| 7,411,830 B2 | 8/2008 | Takeuchi | |
| 7,436,724 B2 | 10/2008 | Nandi | |
| 7,463,528 B2 | 12/2008 | Mokhlesi | |
| 7,583,535 B2 | 9/2009 | Sekar | |
| 7,755,946 B2 | 7/2010 | Dunga | |
| 7,974,133 B2 | 7/2011 | Dunga | |
| 7,974,134 B2 | 7/2011 | Zhang | |
| 2003/0189856 A1 | 10/2003 | Cho | |
| 2006/0285408 A1 | 12/2006 | Bester | |
| 2008/0247253 A1 | 10/2008 | Nguyen | |
| 2009/0003069 A1 | 1/2009 | Lee | |
| 2010/0008151 A1 | 1/2010 | Hwang | |
| 2010/0264547 A1 | 10/2010 | Yanagidaira | |
| 2010/0329026 A1 | 12/2010 | Nakamura | |
| 2011/0205823 A1 | 8/2011 | Hemink | |
| 2011/0235420 A1 | 9/2011 | Sharon | |

OTHER PUBLICATIONS

PCT International Search Report dated Feb. 19, 2013, PCT Patent Application No. PCT/US2012/066909.
PCT Written Opinion of the International Searching Authority dated Feb. 19, 2013, PCT Patent Application No. PCT/US2012/066909.

*Primary Examiner* — Ly D Pham
(74) *Attorney, Agent, or Firm* — Vierra Magen Marcus LLP

(57) ABSTRACT

A non-volatile storage system that performs programming and reading processes. The programming process includes coarse/fine programming and verify operations. Programming is verified by testing for two different threshold voltage levels while applying the same voltage level to the control gate of a memory cell by testing for current levels through the memory cells and adjusting the current levels tested for based on current temperature such that the difference between the two effective tested threshold voltage levels remains constant over temperature variation.

16 Claims, 16 Drawing Sheets

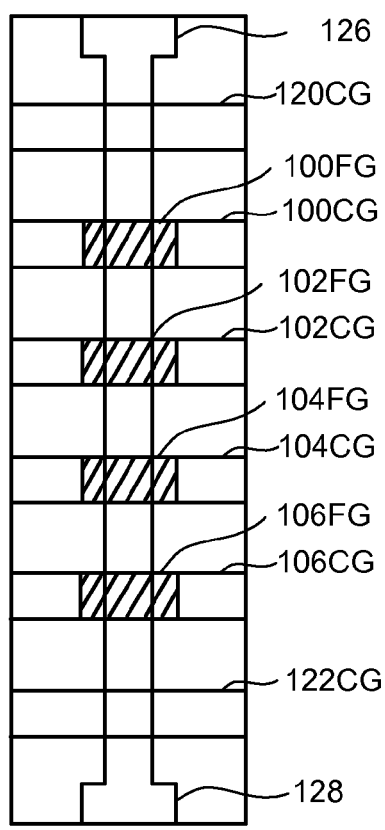
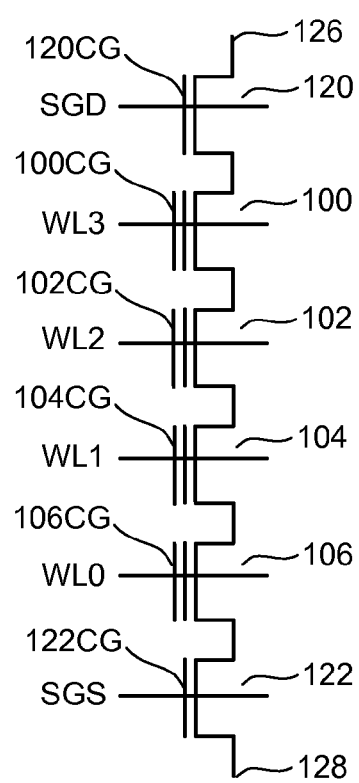
Fig. 1
Fig. 2

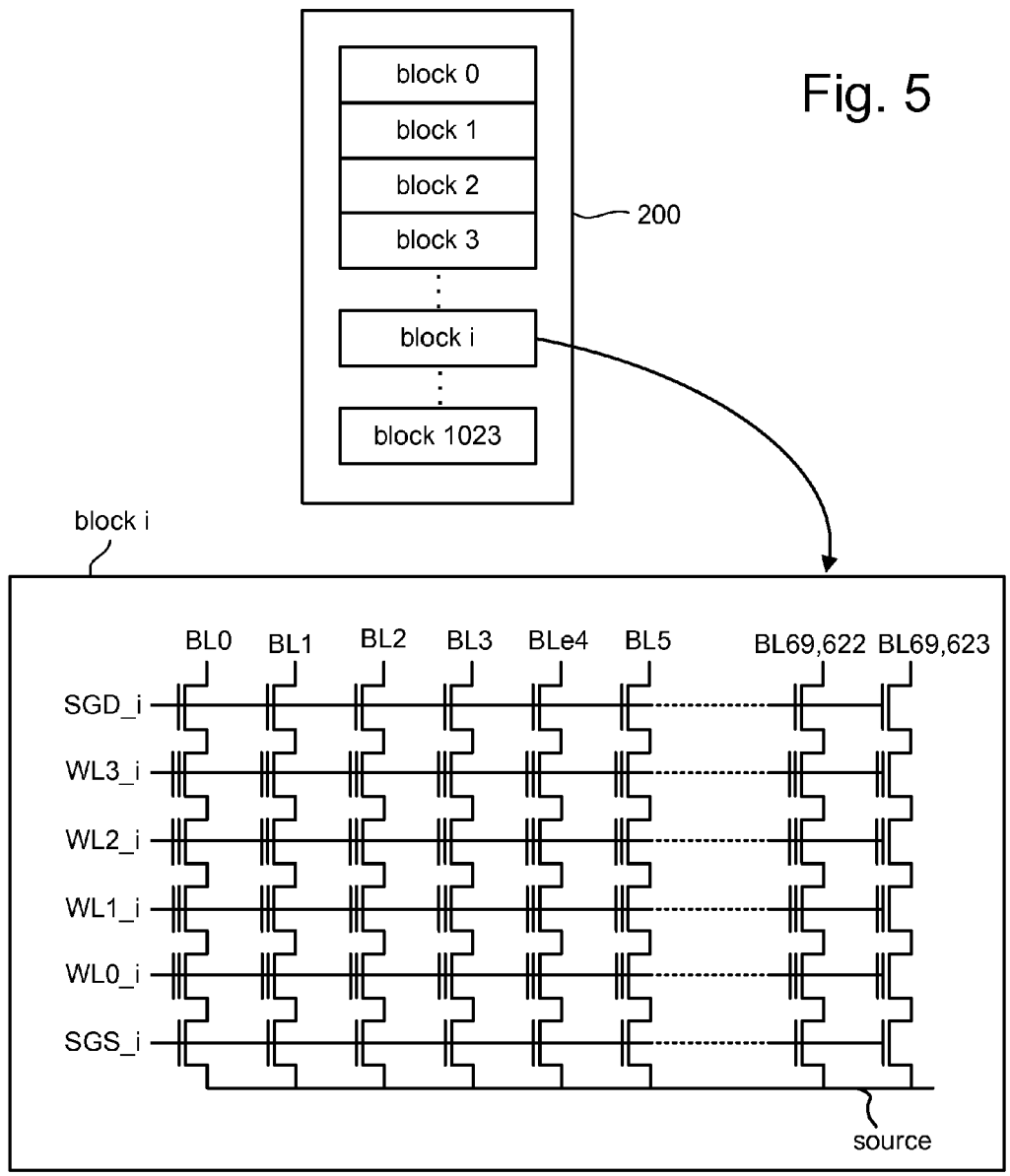

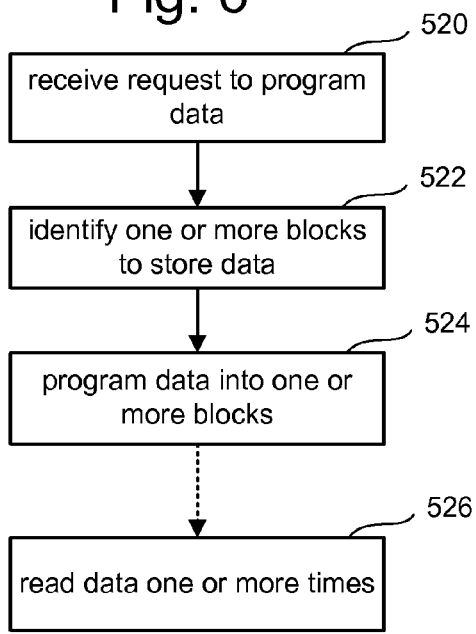
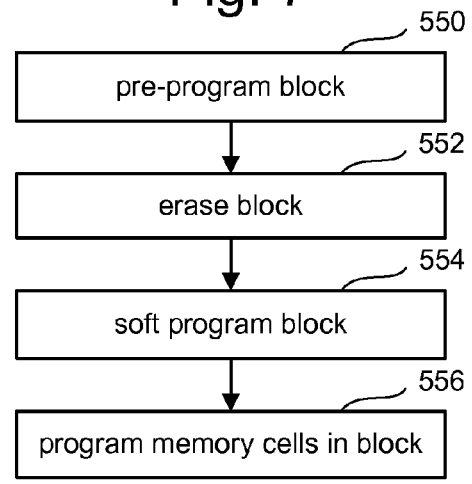

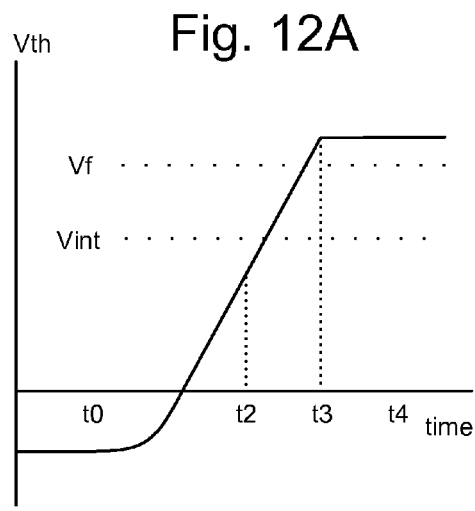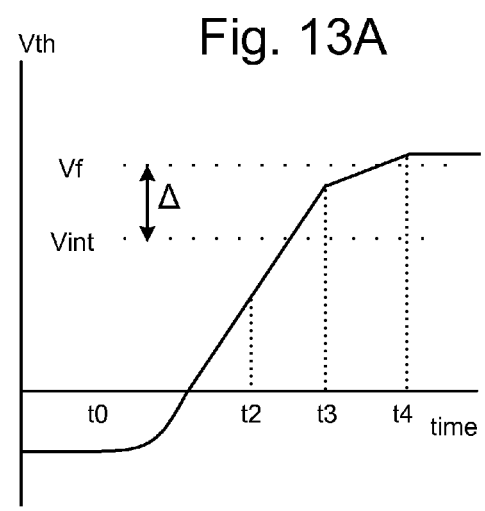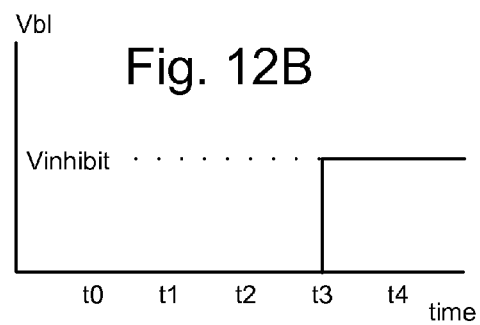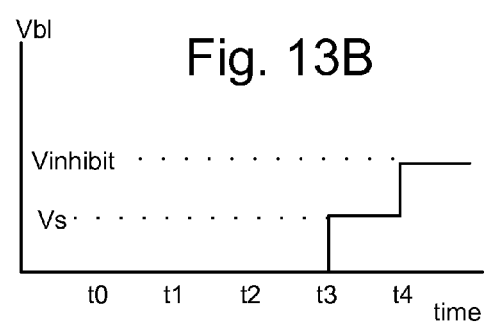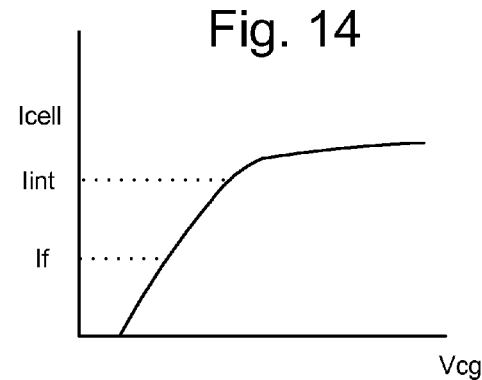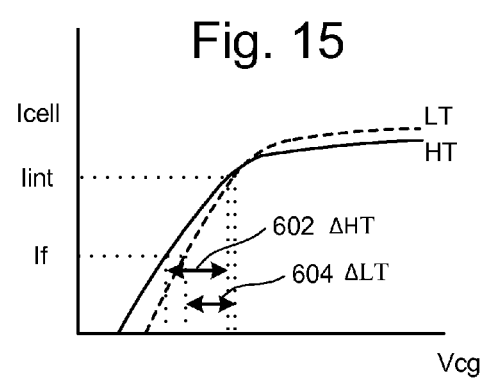

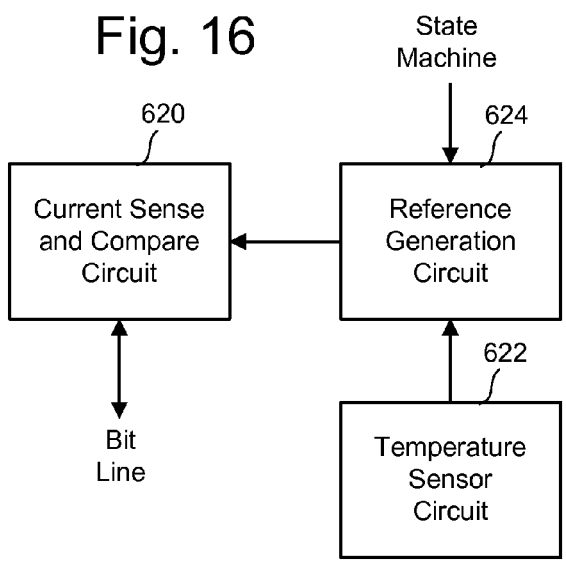
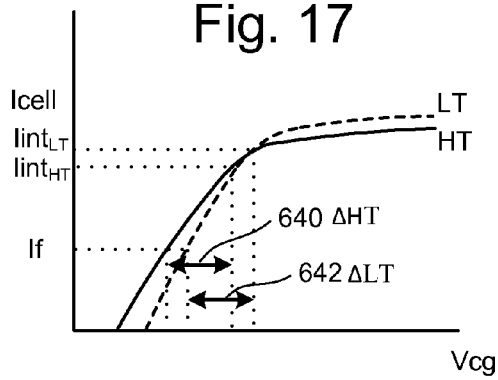
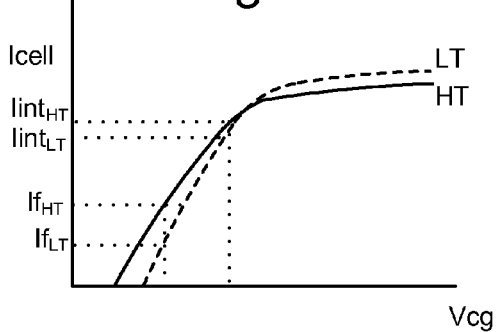

US 8,582,381 B2

TEMPERATURE BASED COMPENSATION DURING VERIFY OPERATIONS FOR NON-VOLATILE STORAGE

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

Typically, the program voltage (Vpgm) is applied to the control gates of the memory cells as a series of pulses. The magnitude of the pulses is increased with each successive pulse by a predetermined step size (e.g. 0.2 v, 0.3 v, 0.4 v, or others). In the periods between the pulses, verify operations are carried out. That is, the programming level of each memory cell of a group of cells being programmed in parallel is sensed between each programming pulse to determine whether it is equal to or greater than a verify level to which it is being programmed. One means of verifying the programming is to test conduction at a specific compare point. The memory cells that are verified to be sufficiently programmed are locked out, for example, by raising the bit line voltage to stop the programming process for those memory cells. The above described techniques, and others described herein, can be used in combination with various boosting techniques to prevent program disturb and with various efficient verify techniques known in the art.

When programming, there is a tradeoff between speed of programming and precision of programming. The precision of programming is related to the distribution of threshold voltages of the programmed memory cells subsequent to the programming process. The tighter the threshold voltage distribution, the easier it is to unambiguously read the memory cells. The need for tight threshold voltage distributions is even more important with multi-state memory cells because the read process needs to unambiguously distinguish between the different threshold voltage distributions. To obtain a tight threshold voltage distribution, a smaller step size is used for the program voltage Vpgm. However, using a smaller step size slows down the programming process.

BRIEF DESCRIPTION OF THE DRAWINGS

FIG. 1 is a top view of a NAND string.

FIG. 2 is an equivalent circuit diagram of the NAND string.

FIG. 5 is a block diagram depicting one embodiment of a memory array.

FIG. 6 is a flow chart describing one embodiment of a process for programming.

FIG. 7 is a flow chart describing one embodiment of a process for programming data into a block of memory cells.

FIGS. 12A, 12B, 13A and 13B are graphs of threshold voltage versus time that describe one embodiment of coarse/fine programming.

FIGS. 14 and 15 are graphs of memory cell current versus control gate voltage.

FIG. 16 is a block diagram of one embodiment of components in sense circuitry.

FIGS. 17 and 18 are graphs of memory cell current versus control gate voltage.

DETAILED DESCRIPTION

Figure 3:
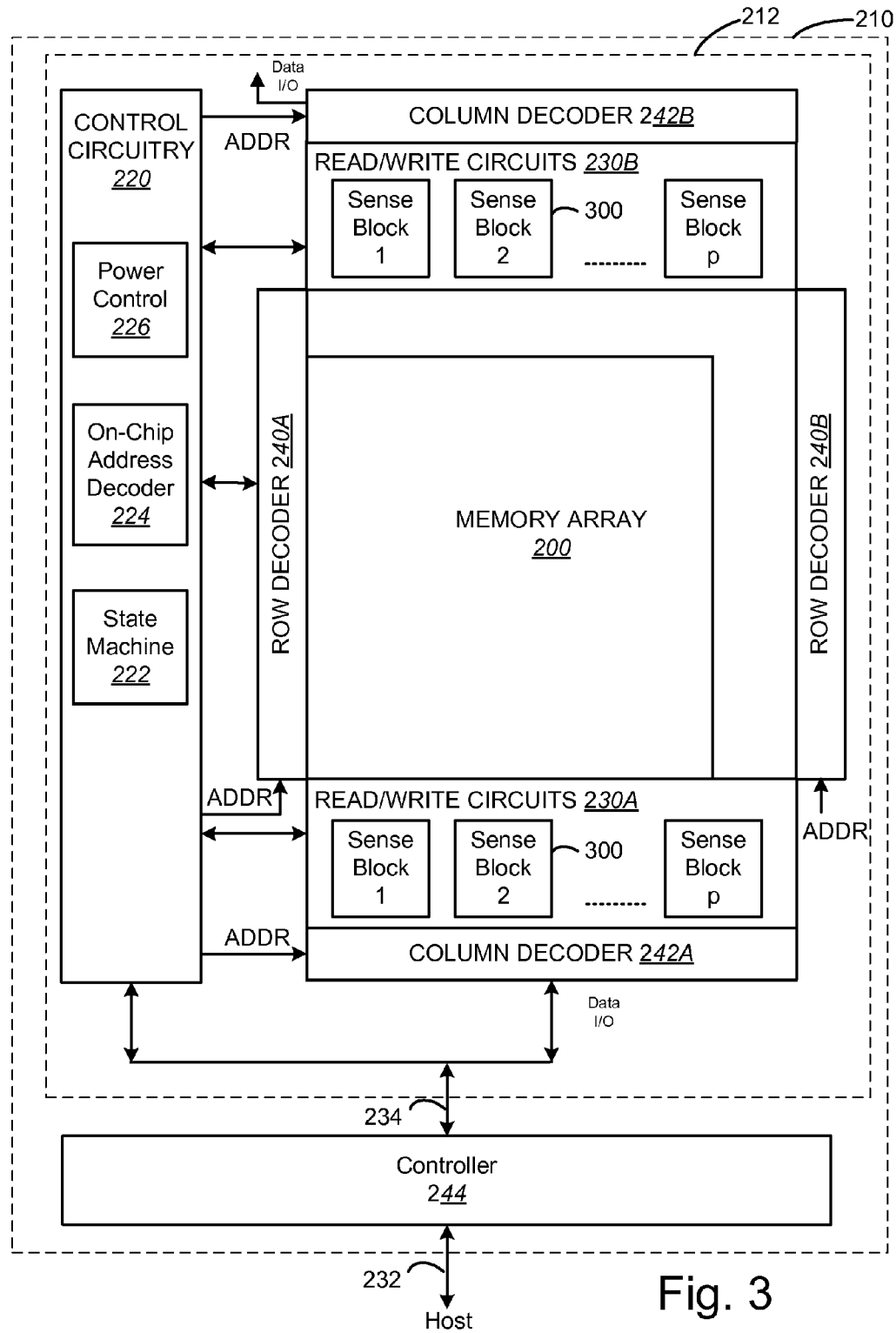
FIG. 3 is a block diagram of a non-volatile memory system.

One solution for achieving tight threshold distributions without unreasonably slowing down the programming process is to use a two phase programming process. The first phase, a coarse programming phase, includes attempts to raise the threshold voltage in a faster manner and paying relatively less attention to achieving a tight threshold distribution. The second phase, a fine programming phase, attempts to raise the threshold voltage in a slower manner in order to reach the target threshold voltage while also achieving a tighter threshold distribution. In one set of embodiments, the first phase is completed when the threshold voltage of the memory cell has reached an intermediate level for the target data state and the second phase is completed when the threshold voltage of the memory cell has reached a final level for the target data state. Testing whether the threshold voltage of the memory cell has reached the intermediate level and/or final level is dynamically adjusted based on temperature in order to account for variances in memory cell operation at different temperatures.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference in their entirety: U.S. Pat. Nos. 5,570,315; 5,774,397; 6,046,935; 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
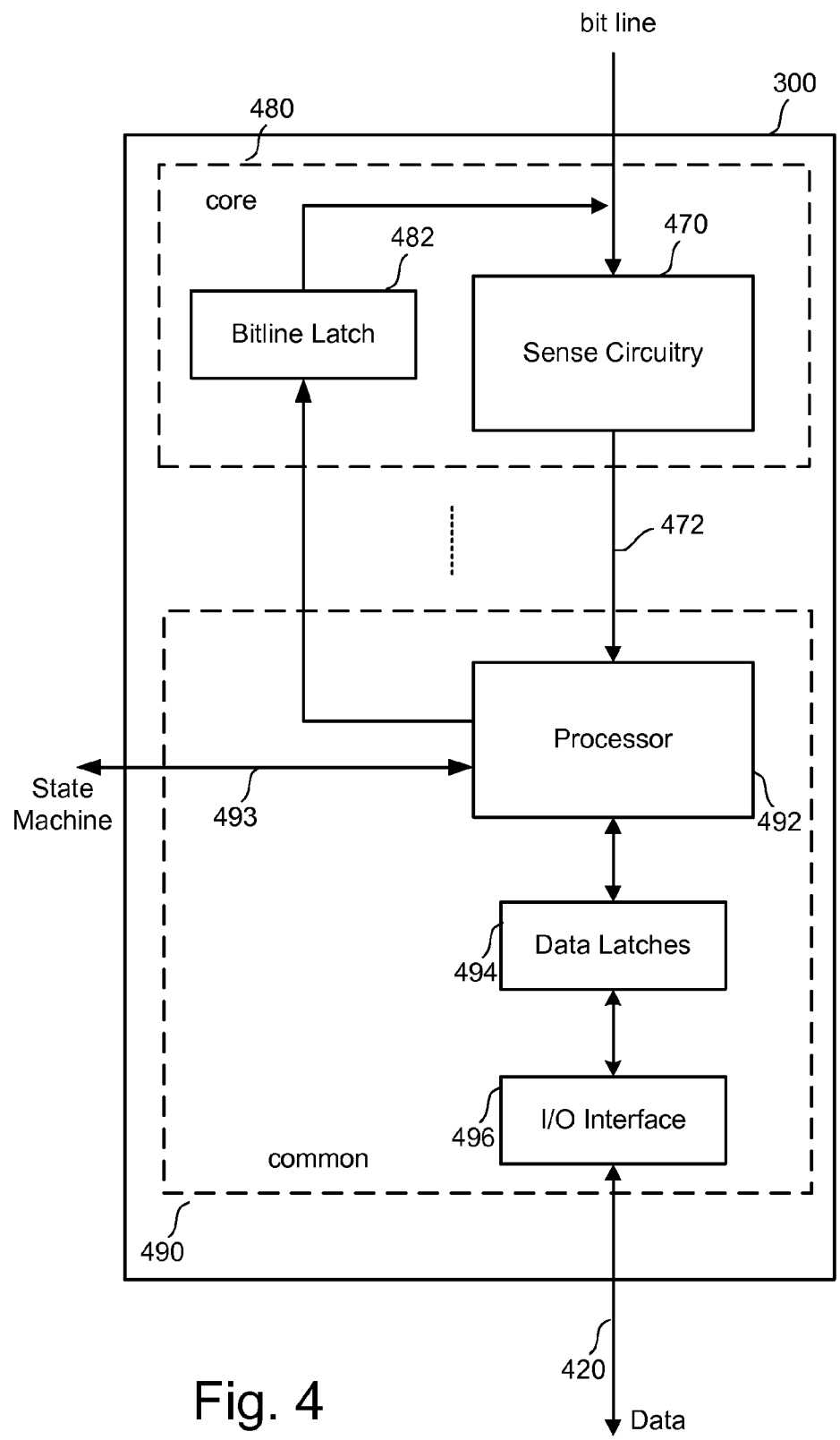
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, . . . BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for programming. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

Figure 8:
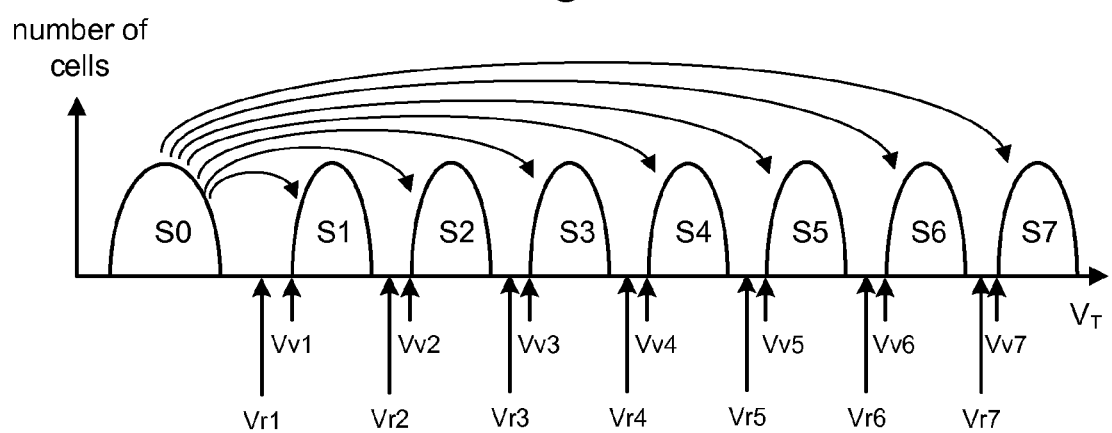
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
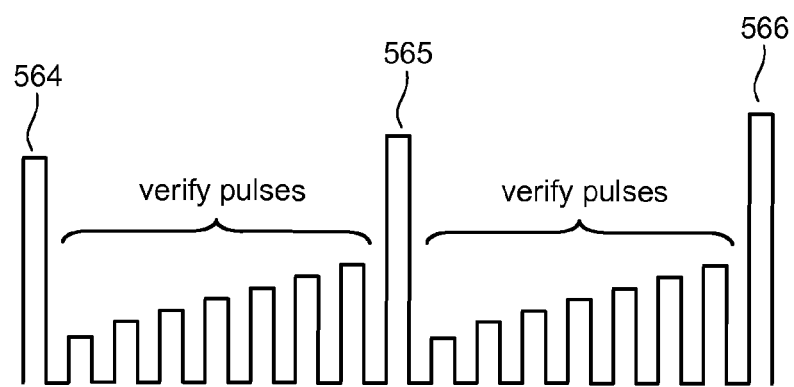
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. Nos. 7,073,103; 7,224,614; 7,310, 255; 7,301,817; U.S. Patent App. 2004/0109362; and U.S. Patent App. 2009/0147573.

Figure 10A:
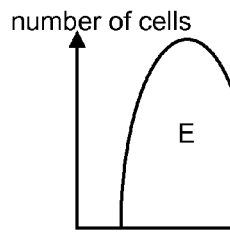
FIGS. 10A-E show various threshold voltage distributions and describe a process for programming non-volatile memory.
Figure 10B:
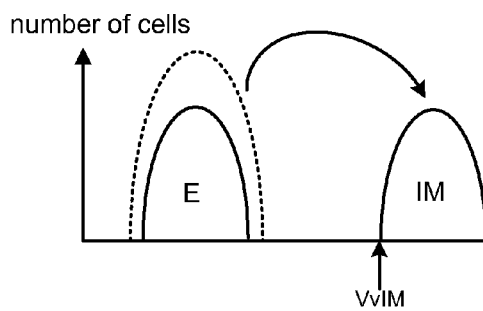

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
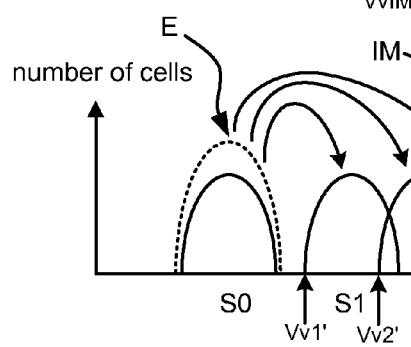
Figure 10D:
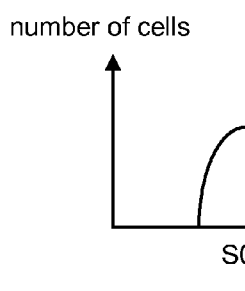
Figure 10E:
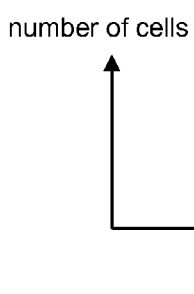

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 11:
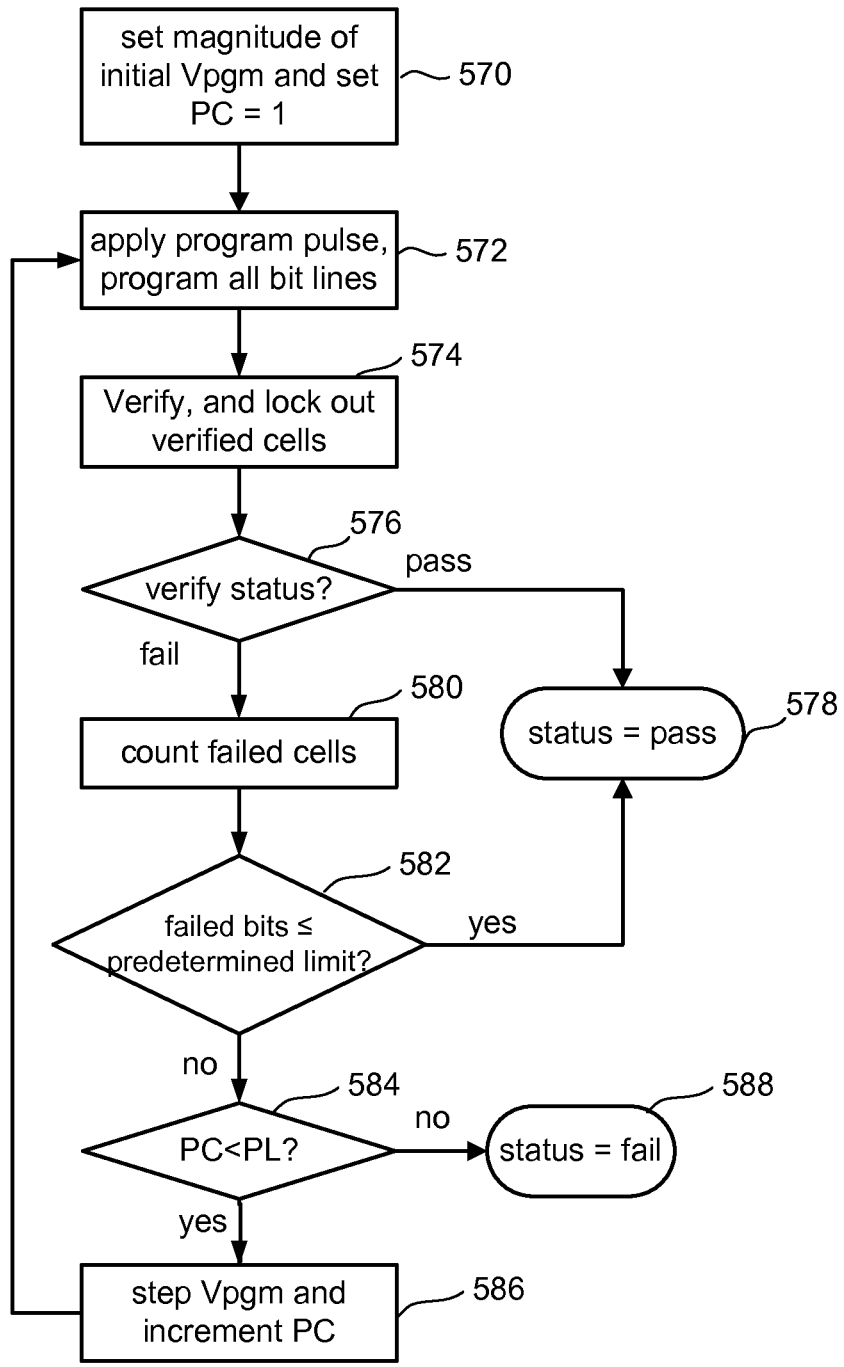
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

When programming data to multiple states (e.g., rather than binary programming), it is important that the programming process be sufficiently precise so that the read process can unambiguously distinguish between the different threshold voltage distributions. For example, the tighter the threshold voltage distribution, the easier it is to unambiguously read the memory cells.

One solution for achieving tight threshold voltage distributions, without unreasonably slowing down the programming process, includes using a two-phase programming process. The first phase, a coarse programming phase, includes an attempt to raise a threshold voltage in a faster manner and paying less attention to achieving a tight threshold voltage distribution. The second phase, a fine programming phase, attempts to raise the threshold voltage in a slower manner in order to reach the target threshold voltage, while also achieving a tighter threshold voltage distribution. One example of a coarse/fine programming methodology can be found in U.S. Pat. No. 6,643,188, incorporated herein by reference in its entirety.

FIGS. 12A, 12B, 13A and 13B provide more details of one example of a coarse/fine programming methodology. FIGS. 12A and 13A depict the threshold voltage of the memory cells being programmed. FIGS. 12B and 13B depict the bit line voltages for the memory cells being programmed. This example of FIGS. 12A, 12B, 13A and 13B uses two verify levels, indicated in the Figures as Vf and Vint. The final target level is Vf. When a threshold voltage of the memory cell has reached Vf, the memory cell will be inhibited from further programming by applying an inhibit voltage to the bit line corresponding to that memory cell. For example, the bit line voltage can be raised to Vinhibit (See FIG. 12B and FIG. 13B). However, when a memory cell has reached a threshold voltage close to (but lower than) the target value Vf, the threshold voltage shift for the memory cell during subsequent programming pulses is slowed down by applying a certain bias voltage to the bit line, typically in the order of 0.3 v to 0.8 v. Because the rate of threshold voltage shift is reduced during the next few programming pulses, the final threshold voltage distribution can be narrower than with other programming methods. To implement this method, a second verify level that is lower than that of Vf is used. This second verify level is depicted in 12A and 13A as Vint, with Vf>Vint. When the threshold voltage of the memory cell is larger than Vint, but still lower than Vf, the threshold voltage shift to the memory cell will be reduced for subsequent programming pulses by applying a bit line bias Vs (FIG. 13B). Note that in this case, two verify operations are required for each state. One verify operation at the corresponding Vf for each state, and one verify operation at the corresponding Vint for each state.

FIGS. 12A and 12B show the behavior of a memory cell whose threshold voltage moves past Vf and Vint in one programming pulse at t2. For example, the threshold voltage is depicted in FIG. 12A to pass Vint and Vf in between t2 and t3. Thus, prior to t3, the memory cell is in the coarse phase. After t3, the memory cell is in the inhibit mode.

FIGS. 13A and 13B depict a memory cell that enters both the coarse and fine programming phases. The threshold voltage of the memory cell crosses Vint in between time t2 and time t3 (e.g., from a programming pulse applies starting at t2). Prior to t3, the memory cell is in the coarse phase. After t3, the bit line voltage is raised to Vs; therefore, the memory cell is in the fine phase. In between t3 and t4, the threshold voltage of the memory cell crosses Vf; therefore, the memory cell is inhibited from further programming by raising the bit line voltage to Vinhibit at t4. If the coarse/fine programming scheme was not being used, the threshold voltage of the memory cells could exceed Vf by a margin much more than depicted in FIG. 13A.

The voltage Vf is greater than the voltage Vint by a difference referred to as Δ (see FIG. 13A). As taught by FIGS. 12A, 12B, 13A and 13B, in some instances it is desirable to optimize Δ. If Δ is too large, the memory cell spends more time in the fine phases (which is slower than the coarse phase), therefore, the programming process is slower. Additionally, after a few pulses in the fine phase, the memory cell threshold voltage will start to change in a manner more like the coarse phase, which defeats the purpose of the fine phase If Δ is too small, too many memory cells will pass Vint and Vf in the same pulse (see FIGS. 12A and 12B), thereby eliminating the fine phase and defeating the purpose of coarse/fine programming (e.g., tighter threshold voltage distributions). Either deviation of Δ (too large or too small) can serve to unnecessarily widen the threshold voltage distributions and potentially result in errors during reading. In one example, Δ is optimized by setting it to be the same as half the step size for successive program pulses (see step 586 of FIG. 11).

One drawback of the immediately above-described coarse/fine programming process is that it requires two consecutive verify operations at two different control gate (Word Line) voltages, for each data state. For example, the wave form of FIG. 9 would include fourteen verify pulses rather than seven. The fourteen verify pulses include two verify pulses (at Vint and Vf) for each data state, where Vf for each data state is the final verify level (Vv1, Vv2, Vv3, Vv4, Vv5, Vv6 and Vv7) and Vint for each data state is at a voltage magnitude less than Vf for each data state by Δ. Having two consecutive verify operations for each data state slows down the program/verify process because the time needed to change the word line voltage is longer than desired. For example, as the word lines become longer to connect with more memory cells, the RC delays increase and slow the down the process of changing the word line voltage. Moreover, slower performance impact due to word line RC delay increase will be greater for more scaled devices.

To address the decrease in speed of the program/verify process because of the time needed to change the word line voltage, a variation of the above-described coarse/fine programming process can be used where the control gate (word line) voltage is the same for both verify operations (verify at Vint and at Vf) for each data state. In this scheme, the sense amplifier will test for two different threshold voltages (e.g., Vint and Vf) by sensing the memory cell for two different currents. This embodiment uses the nature of the CMOS (or other type of) transistor Id-Vg characteristics, in which a higher current will detect a lower threshold voltage and a lower current will detect a higher threshold voltage. For example, FIG. 14 depicts a graph of Icell (current through the memory cell—Id) versus Vcg (the voltage applied to the control gate—Vg) for a memory cell (e.g., transistor). When applying the same voltage at the control gate, testing whether the current through the memory cell is below Iint tests whether the threshold voltage of the memory cell is greater than or equal to Vint and testing whether the current through the memory cell is below If tests whether the threshold voltage of the memory cell is greater than or equal to Vf. Thus, this embodiment (referred to herein as the current sensing verification system) performs the verification by performing two sensing operations, both while the same voltage level is applied to the control gate of the memory cell. During one of the sense operations, the sense amplifier tests whether the current through the memory cell is below Iint. If the current through the memory cell is below Iint, then it is concluded that the threshold voltage is greater than or equal to than Vint. During the second of the sense operations, the systems tests whether the current through the memory cell is below If. If the current through the memory cell is below If, then it is concluded that the threshold voltage is greater than or equal to than Vf.

One example implementation of the current sensing verification system charges a capacitor and then allows the capacitor to discharge through the bit line and NAND string. If the unselected memory cell on the NAND string all receive a large enough control gate voltage to turn them on and act as pass gates, then the charge on the capacitor will effectively be discharged through the selected memory cell to the source line if the voltage applied to the control gate of the selected memory cell was large enough (in comparison to the threshold voltage of the memory cell) to cause the channel of the memory cell to conduct. If the voltage applied to the control gate of the selected memory cell was not large enough (to cause the channel of the memory cell to conduct, the capacitor will not discharge. As the transistors that form the memory cells are not ideal devices, the current will be a function of the control gate voltage, rather than on for control gate voltages above the threshold voltage and off for control gate voltages below the threshold voltage. After a predetermined period of time (known as the strobe time), the voltage across the capacitor can be measured. If the selected memory cell sufficiently conducted current, then a sufficient amount of charge will have dissipated from the capacitor and the voltage would be decreased by at least a predetermined amount. If the selected memory cell did not sufficiently conduct current, then the voltage across the capacitor would not have decreased by the predetermined amount. Therefore, testing the voltage across the capacitor after the strobe time is indication of whether the current was above or below a predetermined current compare level. To test for two current levels (e.g., Icell and Iint), the system can perform two sensing operations using the same control gate voltage and different strobe times. A shorter strobe time is used to test for the higher current (e.g., Iint) corresponding to the lower threshold voltage and the longer strobe time is used to test for the lower current (e.g., If) corresponding to the higher threshold voltage. This verification system for coarse/fine programming saves time by not needing to set up a new control gate voltage between the two sense operations.

One problem with the current sensing verification system is the Icell/Vcg characteristics of the memory cell change over temperature. FIG. 15 depicts a graph of Icell versus Vcg for a memory cell at two different temperatures. The dashed curve labeled LT shows data for a lower temperature. The solid curve labeled HT shows data for a higher temperature. As can be seen, the slope for the two curves are different. This causes the tests for current (described above) to test for different threshold voltages. For example, bidirectional arrow 602 represents the difference (referred to above as Δ) between the effective threshold voltages tested for by the two sensing operations at high temperature. This difference will be referred to as ΔHT. Bidirectional arrow 604 represents the difference (referred to above as Δ) between the effective threshold voltages tested for by the two sensing operations at low temperature. This difference will be referred to as ΔLT. As depicted in FIG. 15, ΔHT is greater than ΔLT. Therefore, it is observed that Δ changes as a function of temperature.

As explained above, it is often desirable to optimize Δ so that it is not too small and not too large. If Δ sufficiently changes with deviations in temperature, it will be difficult to optimize Δ and the threshold voltage distributions of the programmed memory cells may not be as narrow as desired to avoid errors during reading. To avoid this issue, it is proposed to adjust the verify operation based on temperature so that Δ is constant over temperature variations, including that Δ is constant over time. Having a constant Δ will result in narrower threshold voltage distributions for the programmed memory cells, which will help avoid errors during reading, There are multiple ways to adjust the verify operation based on temperature so that Δ is constant over temperature variations and over time. One embodiment includes implementing the current sensing verification system described above and adjusting the current level sensed for during one or both of the sense operations (Vint and VI) based on current temperature such that Δ is constant over temperature variations. In one embodiment, the current level sensed for is adjusted based on current temperature for both sense operations (Vint and Vf). In another embodiment, the current level sensed for is adjusted based on current temperature only for the sense operation pertaining to testing for a threshold voltage of Vint or higher. In yet another embodiment, the current level sensed for is adjusted based on current temperature only for the sense operation pertaining to testing for a threshold voltage of Vf or higher. As discussed above, sensing for the current levels is an example of testing whether the memory cell has at least a specific threshold voltage.

One means for adjusting the current level sensed for is to adjust the strobe time (discussed above). In one example, the strobe time is longer for higher temperatures and shorter for lower temperatures.

In an embodiment that test the current through the memory cell by monitoring the change in voltage of a capacitor being discharged through the selected memory cell, another means for adjusting the current level sensed for is to adjust the voltage level compared against the voltage of the capacitor.

In an embodiment that test the current through the memory cell by monitoring the change in voltage of a capacitor being discharged through the selected memory cell, another means for adjusting the current level sensed for is to adjust the initial voltage level of the capacitor (also called the pre-charge level) before discharging the capacitor. By testing for the same final voltage, but using different pre-charge levels the effects of temperature can be accounted for.

Another means for adjusting the current level sensed for is to adjust current level used to compare against the memory cell current. Other sensing parameters, in addition to the ones discussed above, can also be adjusted.

FIG. 16 is a block diagram depicting one example of a subset of components in sense circuitry 470 (see FIG. 4), including Current Sense Compare Circuit 620, Reference Generation Circuit 624 and Temperature Sensor Circuit 622. Current Sense Compare Circuit 620 is connected to the bit line and can sense the magnitude of the current passing through the bit line and the selected memory cell using any of the means discussed above. In one embodiment, Current Sense Compare Circuit 620 includes a capacitor (or other charge storage device) that is pre-charged and subsequently discharged through the bit line and selected memory cell. Other structures can also be used to sense the current passing through the bit line and the selected memory cell. Temperature Sensor Circuit 622 is a circuit that senses the current temperature and outputs a voltage, current or resistance as a function of current temperature. Temperature sensor circuits known in the art can be used. No special temperature sensor circuit is required. The output of Temperature Sensor Circuit 622 is provided to Reference Generation Circuit 624 which generates/adjusts one or more sensing parameters as a function of the output of Temperature Sensor Circuit 622. Reference Generation Circuit 624 provides those sensing parameters to Current Sense Compare Circuit 620. The generated/adjusted sensing parameters may be any of the parameters discussed above, including strobe time, reference current, reference voltage, pre-charge voltage, or other test parameter. Current Sense Compare Circuit 620 uses the generated/adjusted test parameter to configure one or multiple sensing operations, as discussed above.

FIG. 17 depicts a graph of Icell versus Vcg for a memory cell at two different temperatures, and shows the results for embodiment in which the current level sensed for is adjusted based on current temperature only for the sense operation pertaining to testing for a threshold voltage of Vint or higher. For the lower temperature curve LT (dashed line), the system will test for a current of $Iint_{LT}$. For the higher temperature curve HT (solid line), the system will test for a current of Iint$_{HT}$, with Iint$_{LT}$>Iint$_{HT}$. Bidirectional arrow 640 represents the difference (referred to above as Δ) between the effective threshold voltages tested for by the two sensing operations at high temperature. This difference will be referred to as ΔHT. Bidirectional arrow 642 represents the difference (referred to above as Δ) between the effective threshold voltages tested for by the two sensing operations at low temperature. This difference will be referred to as ΔLT. As depicted in FIG. 17, ΔHT is equal (which includes being very close to equal) to ΔLT. Therefore, it is observed that Δ is constant as a function of temperature.

Note that when only Iint is adjusted, it may result in the threshold voltage distribution (or set of threshold voltage distributions) being shifted. While in many cases a shift will not present a problem or can be accounted for, by adjusting both Iint and If the shifting of threshold voltage distributions can be avoided. FIG. 18 depicts a graph of Icell versus Vcg for a memory cell at two different temperatures, and shows the results for embodiment in which the current levels Iint and If are both adjusted as a function of temperature. In this embodiment, the current levels Iint and If are adjusted so that they represent the same control gate voltage across all temperatures in the operational range of temperatures; therefore, Δ will remain constant.

Figure 19:
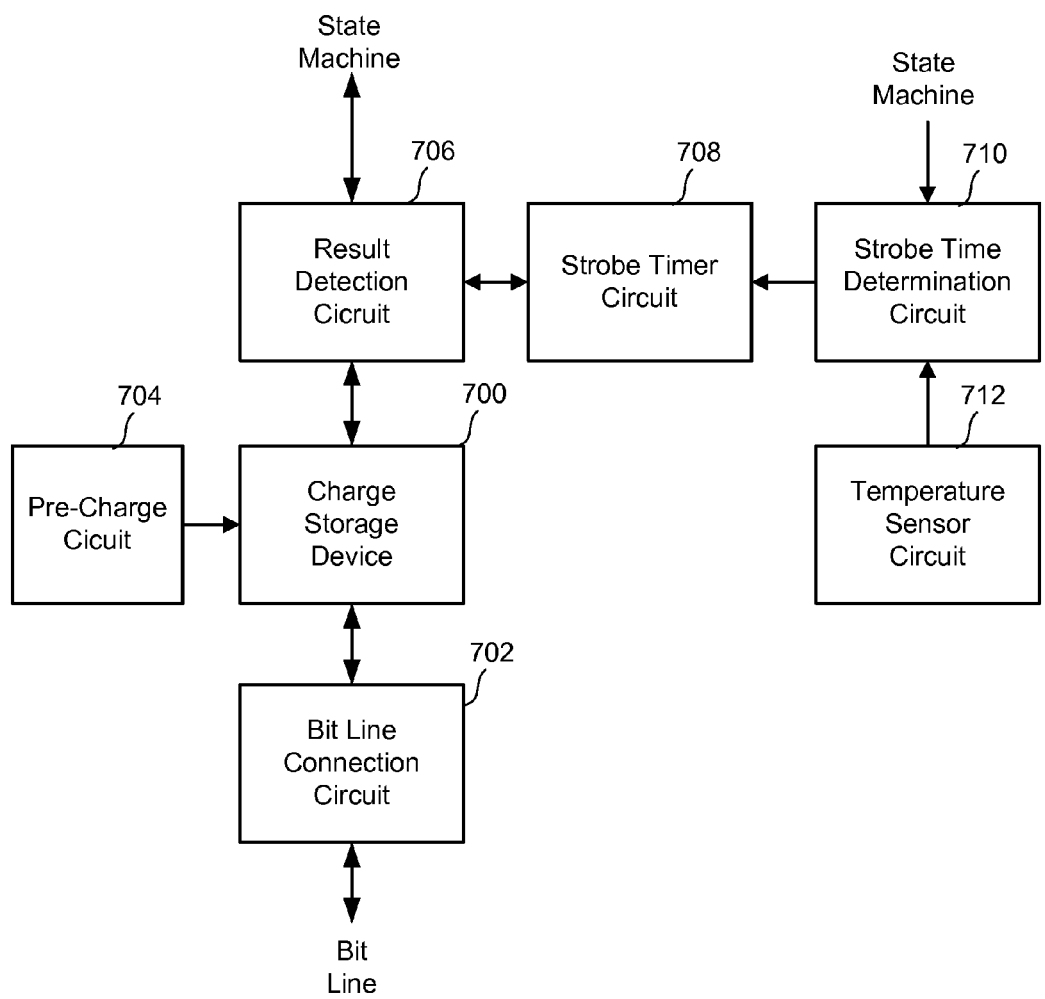
FIG. 19 is a block diagram of one embodiment of components in sense circuitry.

FIG. 19 is a block diagram depicting one example of a subset of components in sense circuitry 470 (see FIG. 4) for the embodiment in which the testing whether the non-volatile storage element has at least a particular threshold voltage during a verify operation includes adjusting the current level sensed for by adjusting a time period (e.g., strobe time) for sensing current through the non-volatile storage element based on current temperature. The structure of FIG. 19 is an example implementation of the system of FIG. 16.

FIG. 19 shows charge storage device 700 (which can be a capacitor or other type of storage device) in communication with a Bit line Connection Circuit 702, Pre-charge Circuit 704 and Result Detection Circuit 706. Bit line Connection circuit is in communication with the bit line. Result Detection Circuit 706 is in communication with the State Machine (discussed above) and Strobe Timer Circuit 708. Temperature Sensor Circuit 712 provides an output to Strobe Time Determination Circuit 710, which also receives an input from the State Machine. The output of strobe time determination circuit 710 is provided to strobe timer circuit 708. Temperature Sensor Circuit 712 is a circuit that senses the current temperature and outputs a voltage, current or resistance as a function of current temperature. Temperature circuits known in the art can be used. No special temperature sensor circuit is required. In one embodiment, Temperature Sensor Circuit 712 is on the same integrated circuit as the rest of the memory system (depicted in FIG. 3). The output of Temperature Sensor Circuit 712 is provided to Strobe Time Determination circuit 710. Based on whether the sense circuitry is testing whether nonvolatile storage element has at least a threshold voltage of Vf or Vint, and the current temperature, Strobe Time Determination circuit 710 will determine the strobe time for allowing the charge storage device 700 to dissipate its charge through the bit line and selected memory cell. That determined strobe time is provided to Strobe Timer circuit 708 which will keep track of the time elapsed while discharging charge storage device 700 and indicates to Result Detection circuit 706 when the strobe time has elapsed.

Bit Line Connection circuit 702 is used to connect charge storage device 700 to the bit line and disconnect charge storage device 700 from the bit line. Pre-charge Circuit 704 is used to pre-charge the charge storage device 700 to a pre-determined voltage. After pre-charging charge storage device 700, Bit line Connection Circuit 702 will connect charge storage device 700 to the bit line and allow the charge storage device to dissipate its charge through the bit line and the selected memory cell. After the strobe time has elapsed, Strobe Timer circuit 708 will alert Result Detection circuit 706 that the strobe time has elapsed and Result Detection circuit 706 will sense whether a pre-determined current flowed through the selected memory cell in response to discharging the storage device 700. In one embodiment, Result Detection circuit 706 will test the voltage of charge storage device 700 at the end of the strobe time and compare it to the pre-charge voltage. The change in voltage of the charge storage device 700 can be used to calculate current information. If the change in voltage is greater than a particular pre-determined value, then it is concluded that the current through the memory cell was greater than the current being sensed for.

Figure 20:
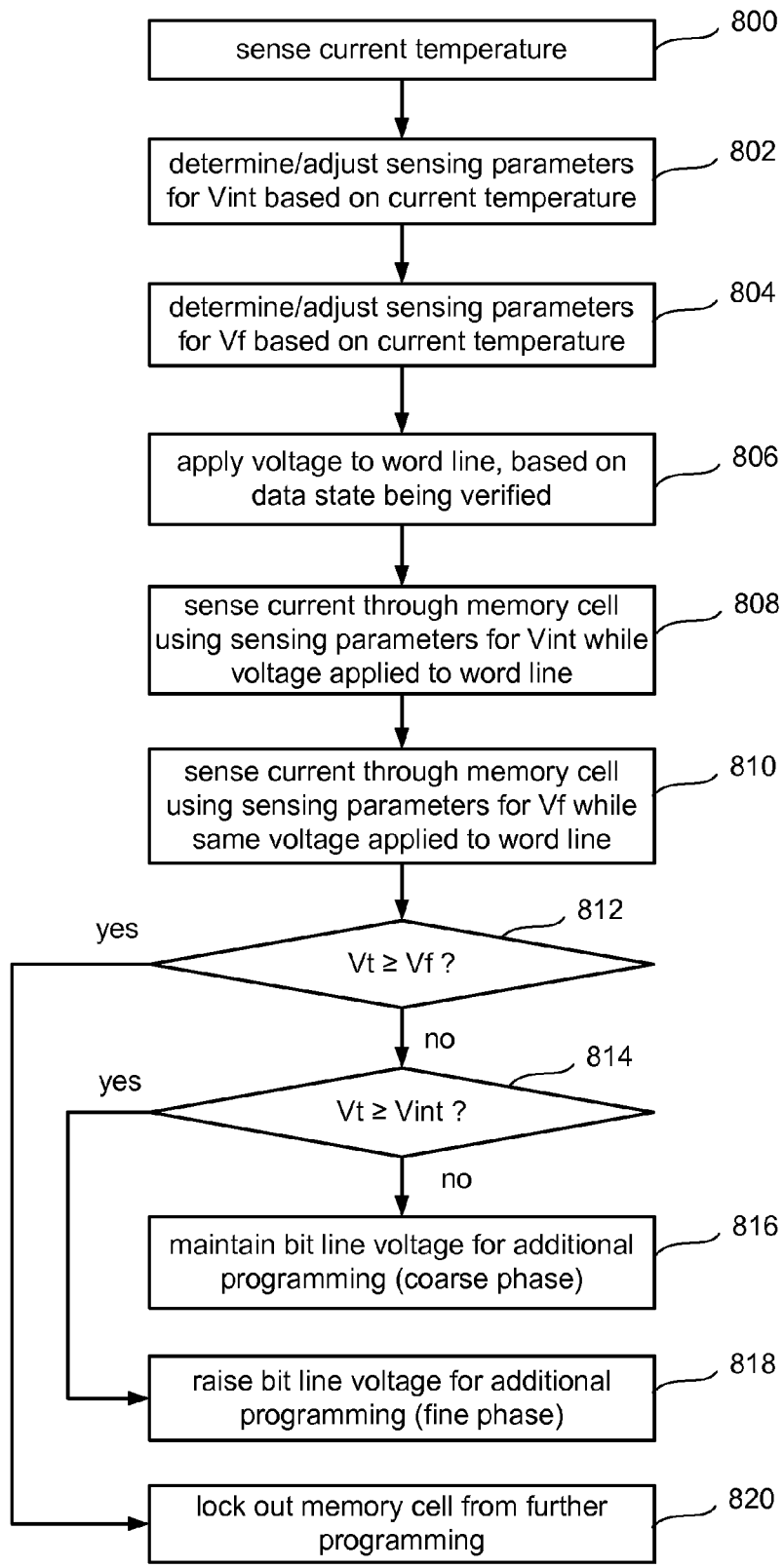
FIG. 20 is a flow chart describing one embodiment of a verify process.

FIG. 20 is a flowchart describing one embodiment of a process for performing verification during a programming process. The method depicted in FIG. 20 is one example implementation of step 574 of FIG. 11. In step 800 of FIG. 20, the system will sense the current temperature. In step 802, the system will determine/adjust the sensing parameters for the intermediate voltage compare point Vint based on current temperature. Any of the sensing parameters discussed above can be determined/adjusted. In step 804, the system will determine/adjust sensing parameters for the final verify compare value Vf based on the current temperature. Any of the sensing parameters discussed above can be adjusted. In some embodiments, step 802 is performed, but step 804 is not performed. In other embodiments, step 804 is performed, but step 802 is not performed. In some embodiments, both steps 802 and 804 are both performed.

In step 806, a voltage is applied to the word line for the selected memory cell being programmed and verified. This word line voltage is applied based on the data state being verified. As explained above, different control gate voltages are used to verify programming to different data states. As discussed above, for each data state, there will be two sensing operations, one for the respective Vf and one for the respective Vint. The same word line voltage will be applied to the word line for both sensing operations for a given data state. In step 808, the system will sense current through the memory cell for the first sensing operation using the sensing parameters for Vint while the voltage (see step 806) is applied to the word line. Step 808 is the first sensing operation. In step 810, the system will sense current through the memory cell using the parameters for Vf while the same voltage is applied to the word line. Step 810 is the second sensing operation. Step 808 effectively tests whether the nonvolatile storage element has a threshold voltage of at least Vint by sensing whether nonvolatile storage element has less than the current level Iint while applying the voltage level to the control gate (see step 806). Note that the current level Iint is indicative of the threshold voltage level Vint at a particular temperature. Step 808 is effectively testing whether nonvolatile storage element has a threshold voltage of Vf by sensing whether nonvolatile storage element has less than the current level If while applying the same control gate voltage as in step 808. Step 802 includes adjusting Iint and step 804 includes adjusting If based on (as a function of) current temperature such that the differences between the threshold voltage represented by the adjusted one or more current levels is constant over temperature variations. That is, Δ remains constant over temperature variations.

If it is determined that the threshold voltage of the memory cell is greater than or equal to Vf (see step 812), then in step 820 that memory cell is locked out from further programming for this particular programming process. If not, it is tested whether the threshold voltage in memory cell is greater than or equal to Vint (step 814). If the threshold voltage in the memory cell is greater than or equal to Vint, then the bit line voltage is raised to Vs, as discussed above, to slow down programming and enter the fine phase. If the threshold voltage is below the Vint, then the bit line voltage is maintained at Vs so that additional coarse programming can be performed.

In one embodiment, steps 812 and 814 are implemented to determine that the nonvolatile storage element has a threshold voltage greater than Vf if the nonvolatile storage element has a current that is less than Iint while applying the voltage to the word line from step 806. If the nonvolatile storage element has a current less than Iint, then the nonvolatile storage element has a threshold voltage greater than Vint. If the nonvolatile storage element has a current that is less than the current level Iint and greater than If, the nonvolatile storage element has a threshold voltage between Vint and Vf. If the nonvolatile storage element has a current greater than or equal to Iint, then the threshold voltage of the nonvolatile storage element is less than Vint. As discussed above with respect to FIG. 11, the process of FIG. 20 is performed after applying a common programming pulse to the control gate of the nonvolatile storage element and for the purpose of verifying whether the nonvolatile storage element is properly programmed in response to the most previous programming pulse.

Figure 21:
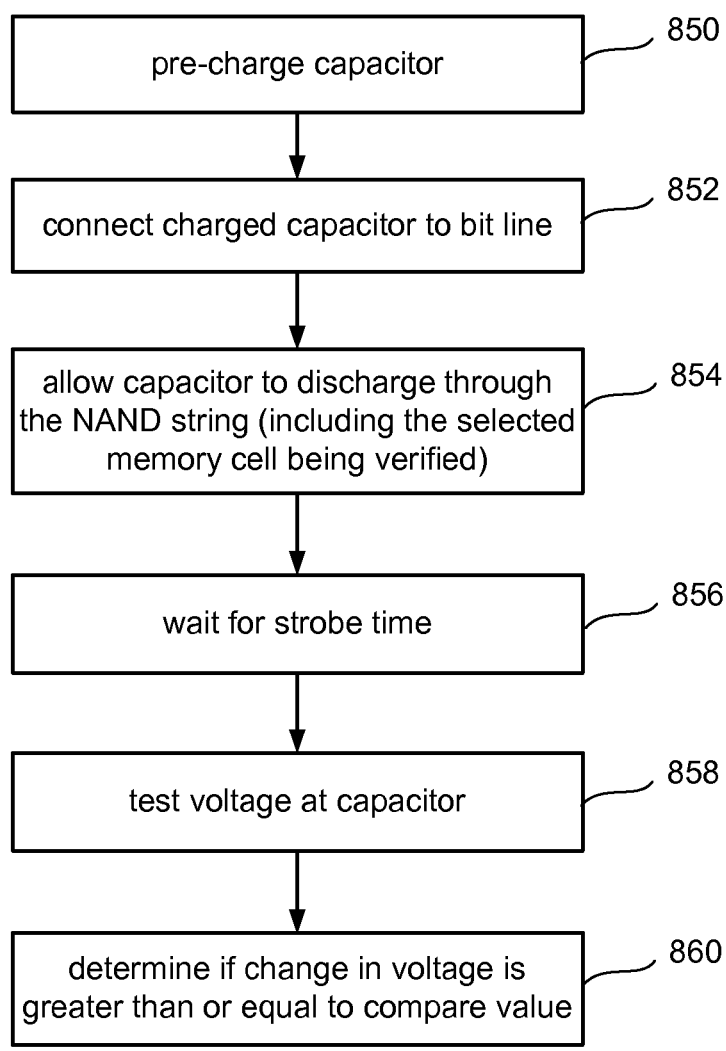
FIG. 21 is a flow chart describing one embodiment of a process for sensing current through a memory cell.

FIG. 21 is a flowchart describing one embodiment for sensing current through the memory cell, and includes one example implementation of steps 808 and 810. The process of FIG. 21 will be performed once for implementing step 808 and another time for implementing step 810. The embodiment of FIG. 21 assumes a structure in which a charge storage device will discharge its charge through the selected memory cell in order to detect current. In the example of FIG. 21, the charge storage device 700 comprises a capacitor. However, in other embodiments, other types of charge storage devices can also be used.

In step 850 of FIG. 21, the capacitor will be pre-charged to a pre-determined voltage level. In step 852, the pre-charged capacitor will be connected to the bit line (see Bit line Connection Circuit 702). In step 854, the capacitor will be allowed to discharge its charge through the bit line and NAND string (including the selected memory cell being verified). The system will wait for the strobe time in step 856. As discussed above, the strobe time is adjusted based on current temperature. At the conclusion of the strobe time (step 858), the system (e.g., result detection circuit 706) will test the voltage across the capacitor. The system will calculate the change in voltage across the capacitor from the pre-charge voltage to the voltage detected in step 858. In step 860, this calculated change in voltage is compared to a compare value. If the change in voltage is greater than or equal to the compare value, then it is assumed that the memory cell conducted current greater than the current level being sensed for.

Figure 22:
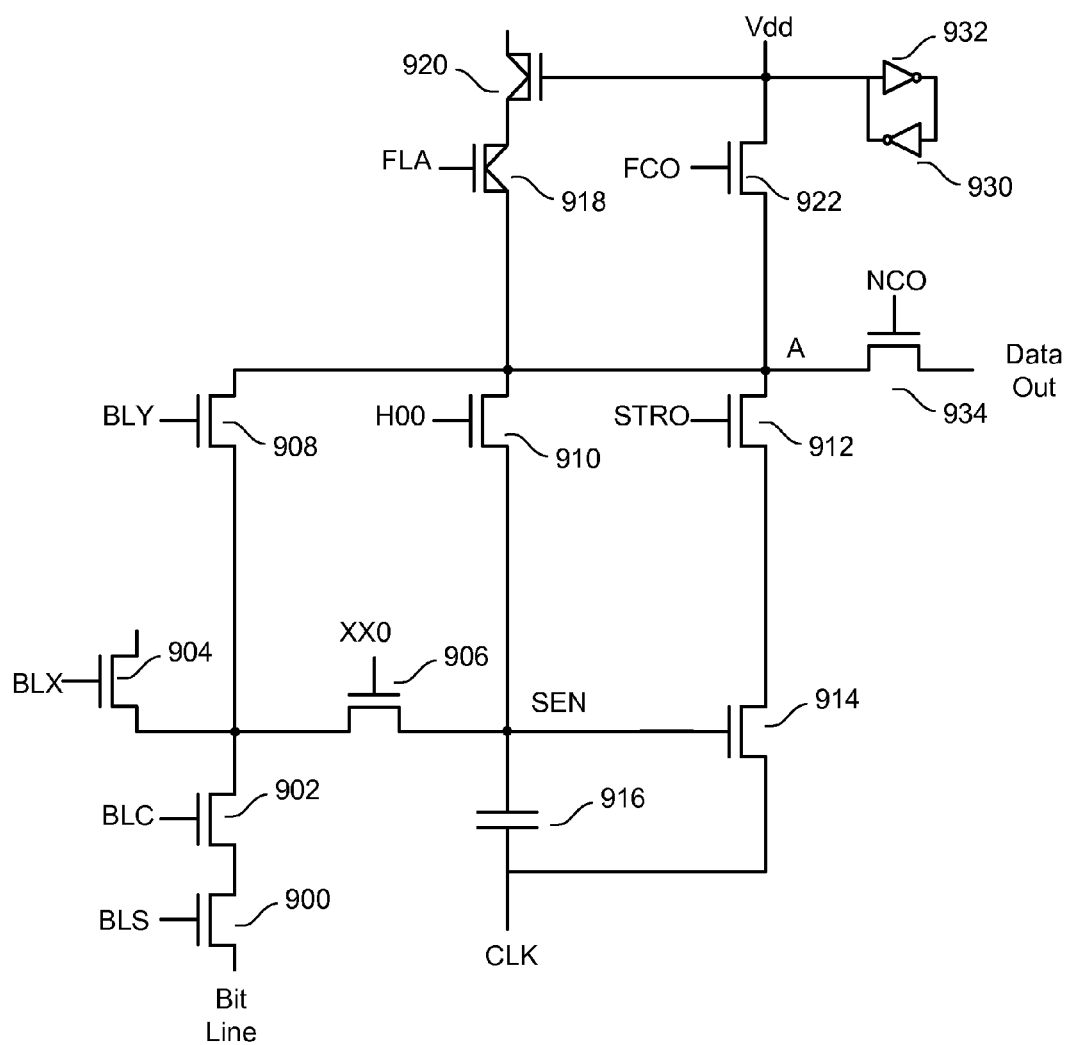
FIG. 22 is a schematic diagram of one embodiment of sense circuitry.
Figure 23:
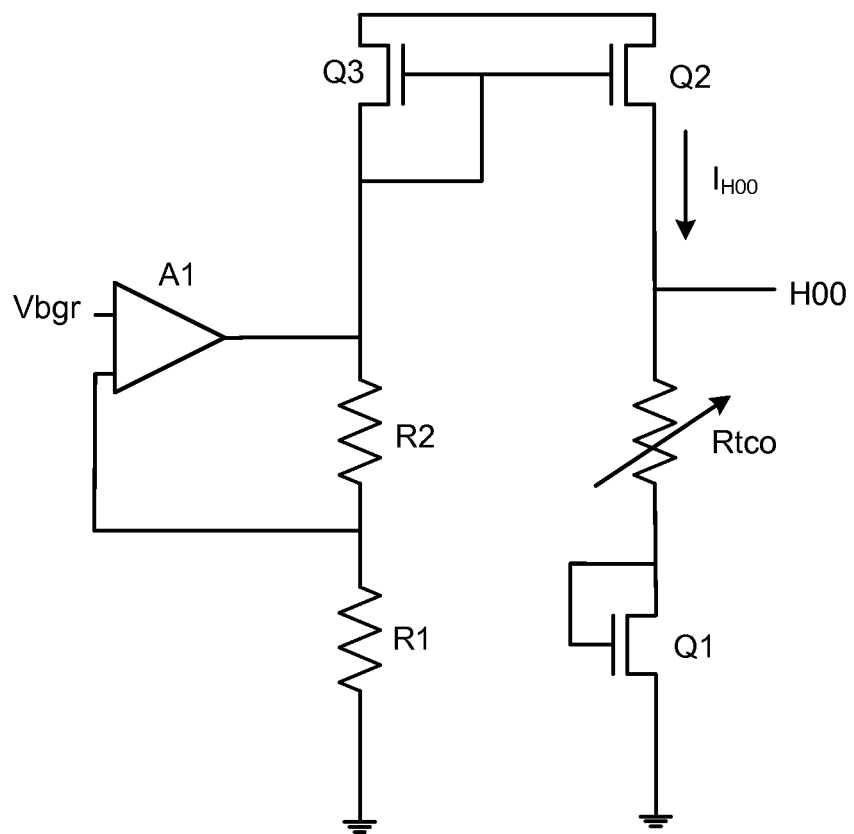
FIG. 23 is a schematic diagram of one embodiment of a circuit that generate a control signal for pre-charging the sense circuitry.
Figure 24:
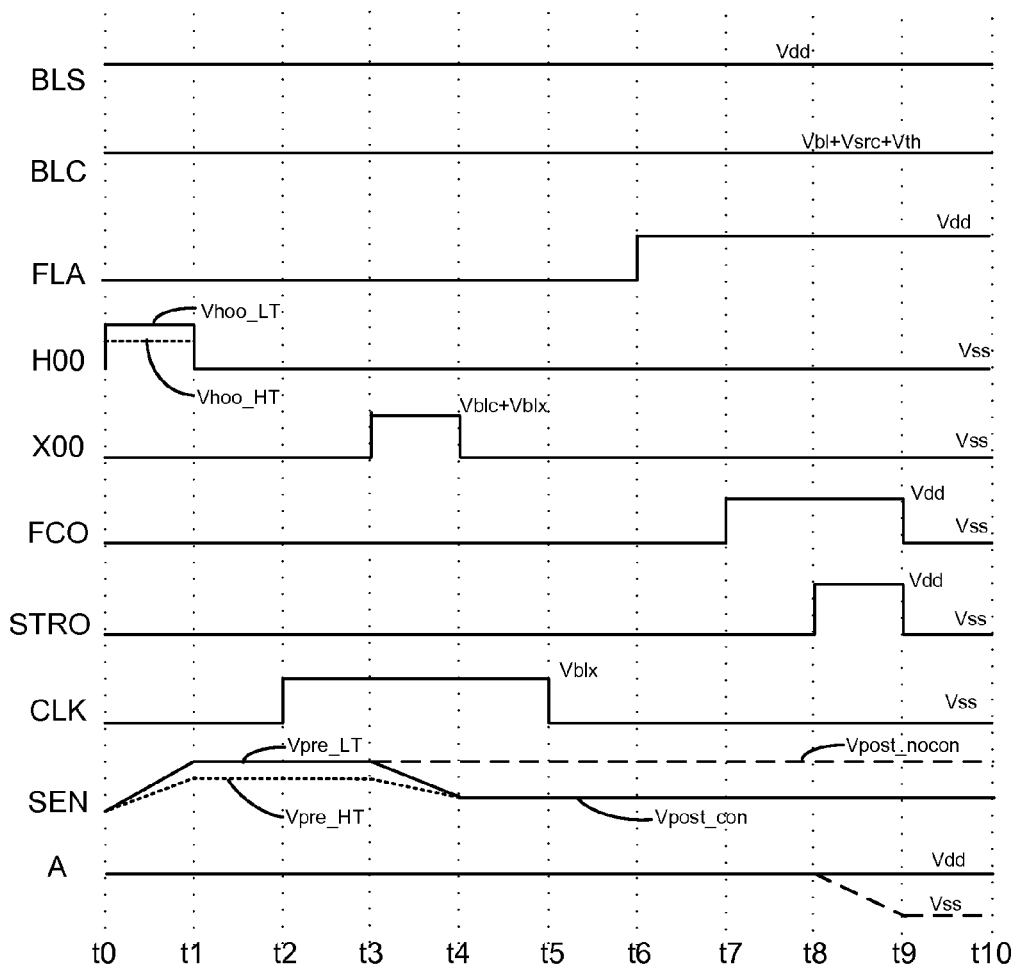
FIG. 24 is a timing diagram that describes the behavior of signals depicted in FIG. 22.

FIGS. 22-24 describe the embodiment that includes adjusting the current level sensed for based on current temperature by setting the magnitude of the pre-charging of a charge storage device (e.g., capacitor) based on the current temperature. This embodiment will perform the processes of FIGS. 20 and 21. For example, when performing the process of FIG. 20, steps 802 and 804 include determining the magnitude of the pre-charging of the capacitor (or other storage device). As in other embodiments, either step 802 or step 804 (or neither) can be skipped. When the method of FIG. 21 is performed, the step of pre-charging the capacitor (step 850 of FIG. 21) includes pre-charging the capacitor (or other storage device) to the pre-charging level that was determined based on temperature.

FIG. 22 is a schematic diagram depicting a circuit from sense circuitry 470 (see FIG. 4). As described below, the circuit of FIG. 22 will pre-charge a capacitor to a magnitude based on current temperature, discharge the capacitor through the memory cell for a period of time, and sense voltage at the capacitor after the period of time. The sense voltage will be indicative of whether the memory cells conducted the current being sensed for, which is indicative of whether the threshold voltage of the memory cell is greater than or less than threshold voltage being tested for. If the threshold voltage of the memory cell is greater than the threshold voltage being tested, then the memory cell will enter the fine phase or complete programming, as appropriate based on the processes described above. Thus, the circuit of FIG. 22 can be used for the coarse/fine programming discussed above or for other systems that do not use coarse/fine programming.

FIG. 22 shows transistor 900 connected to the Bit Line and transistor 902. Transistor 900 receives the signal BLS at its gate, and is used to connect to or isolate the Bit Line. Transistor 902 receives the signal BLC at its gate, and is used as a voltage clamp. The gate voltage BLC is biased at a constant voltage equal to the desired Bit Line voltage plus the threshold voltage of transistor 902. The function of transistor 902, therefore, is to maintain a constant Bit Line voltage during a verify operation, even if the current through the Bit Line changes.

Transistor 902 is connected to transistors 904, 906 and 908. Transistor 906 is connected to capacitor 916. The purpose of transistor 906 is to connect capacitor 916 to Bit Line 900 and disconnect capacitor 916 from Bit Line 900 so that capacitor 916 is in selective communication with Bit Line 900. In other words, transistor 906 regulates the strobe time mentioned above with respect to step 856. That is, while transistor 906 is turned on capacitor 916 can discharge through the Bit Line, and when transistor 906 is turned off capacitor 916 cannot discharge through the Bit Line.

The node at which transistor 906 connects to capacitor 916 is also connected to transistor 910 and transistor 914. Transistor 910 is connected to transistors 908, 912 and 918. Transistor 918 is also connected to transistor 920. Transistors 918 and 920 are PMOS transistors while the other transistors of FIG. 22 are NMOS transistors. Transistors 910, 918, and 920 provide a pre-charging path to capacitor 916. A voltage (e.g. Vdd or other voltage) is applied to the source of transistor 920. By appropriately biasing transistors 910, 918 and 920, the voltage applied to the source of transistor 920 can be used to pre-charge capacitor 916. After pre-charging, capacitor 916 can discharge through the Bit Line via transistor 906 (assuming that transistors 900 and 902 are conducting).

The circuit of FIG. 22 includes inverters 930 and 932 forming a latch circuit. The output of inverter 932 is connected to the input of inverter 930 and the output of inverter 930 is connected to the input of inverter 932. as well as transistors 920 and 922. The input of inverter 932 will receive Vdd and the two inverters 930, 932 will act as a latch to store Vdd. The input of inverter 932 can also be connected to another value. Transistors 912 and 922 provide a path for communicating the data stored by inverters 930 and 932 to transistor 914. Transistor 922 receives the signal FCO at its gate. Transistor 912 receives the signal STRO at its gate. By raising or lowering FCO and STRO, a path is provided or cut off between the inverters 930, 932 and transistor (sensing switch) 914. The gate of transistor 914 is connected capacitor

916, transistor 906 and transistor 910 at the node marked SEN. The other end of capacitor 916 is connected to the signal CLK.

As discussed above, capacitor 916 is pre-charged via transistors 910, 918 and 920. This will raise the voltage at the node SEN to a pre-charge voltage level (Vpre). When transistor 906 turns on, capacitor 916 can discharge its charge through the Bit Line and the selected memory cell if the threshold voltage of the memory cell is below the voltage level being tested for. If the capacitor 916 is able to discharge, then the voltage at the capacitor (at the SEN node) will decrease.

The pre-charge voltage (Vpre) at the SEN node is greater than the threshold voltage of transistor 914; therefore, prior to the strobe time (the time the capacitor is allowed to discharge through the bit line), transistor 914 is on (conducting). Since transistor 914 is on during the strobe time, then transistor 912 should be off. If the capacitor does not discharge during the strobe time, then the voltage at the SEN node will remain above the threshold voltage of transistor 914 and the charge at the inverters 930, 932 can be discharged into the CLK signal when STRO turns on transistor 912. If the capacitor discharges sufficiently during the strobe time, then the voltage at the SEN node will decrease below the threshold voltage of transistor 914; thereby, turning off transistor 914 and the data (e.g., Vdd) stored at inverters 930, 932 from being discharged through CLK. So testing whether the diodes 30, 32 maintain their charge or discharge will indicate the result of the verification process. In one embodiment, the result can be read at node A via transistor 934 (Data Out) by turning on transistor 934 gate signal NCO.

The pre-charge level of capacitor 916 (and, thus, the pre-charge voltage at node SEN) is limited by the current passing through transistor 910. The current that passes through transistor 910 is limited by the gate voltage H00. As such, the pre-charge voltage at node SEN is limited by the voltage H00 less the threshold voltage of transistor 910. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

FIG. 23 is a circuit that regulates the voltage of H00 as a function of current temperature. FIG. 23 shows Opamp A1 with one input receiving the voltage Vbgr (e.g., a temperature insensitive voltage of approximately 1.2 volts or other value) and the second input receiving feedback. The output of Opamp A1 is connected to the top of resistor R2. The bottom of resistor R2 is connected to the top of resistor R1 and the feedback input to Opamp A1. The bottom of resistor R1 is connected to ground. The top of resistor R2 is connected to Q3 and the gates of both transistors Q2 and transistor Q3. Transistor Q2 is also connected to adjustable resistance circuit Rtco. The bottom of adjustable resistance circuit Rtco is connected to transistor Q1. The other end of transistor Q1 is connected to ground. The top of adjustable resistance circuit Rtco provides the signal H00 (discussed above). Adjustable resistance circuit Rtco is a temperature circuit that senses current temperature and changes resistance based on the sensed current temperature. This is a standard circuit known in the art. The voltage at signal H00 is equal to $V_{H00}=T_{H00}*Rtco+Vthq-1$, where Vthq1 is the threshold voltage of transistor Q1. In operation, the lower the temperature sensed by adjustable resistance circuit Rtco, the higher the voltage $V_{H00}$ which results in greater magnitude of pre-charging of capacitor 916. A higher temperature results in a lower voltage $V_{H00}$, which limits the current through transistor 910, thereby. limiting the pre-charging of capacitor 916 and reducing the pre-charge voltage Vpre at node SEN.

FIG. 24 is a timing diagram describing the behavior of various signals from FIG. 22. During the verify operation depicted in FIG. 24, the signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 902. The signal FLA starts at Vss at t0 and goes to Vdd at T6. When the signal FLA is at Vss, the pre-charging path is regulated by transistor 910. As explained above with respect to FIG. 24, the voltage of H00 is a function of temperature. At t0, the voltage of H00 is raised to a pre-charge level. The raising of the voltage at H00 turns on transistor 910 and opens up the pre-charge path. The magnitude of the voltage at H00 is set by the circuit of FIG. 34. There will be a larger voltage magnitude at H00 for lower temperatures. The magnitude of H00 is smaller for higher temperatures. FIG. 24 shows H00 going to Vh00_LT for low temperatures or Vh00_HT for a higher temperature, with Vh00_LT>Vh00_HT. Note that the circuit of FIG. 23 does not produce only two voltage magnitudes. In one embodiment, the output of the circuit of FIG. 23 is linear function with respect to temperature so that there are many different possible voltage magnitudes for H00, depending on temperature. Two examples of voltage magnitudes are depicted in FIG. 24 for the signal H00. The signal H00 will stay at the pre-charge voltage (Vh00_LY or Vh00_HT) until time t1. While H00 is high, transistor 910 turns on and capacitor 916 will pre-charge between T0 and T1, as depicted by the voltage at SEN (depicted second from the bottom on FIG. 24). At time t1, H00 is brought down to Vss and the pre-charging is completed.

The signal X00 is used to allow capacitor 916 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, capacitor 916 will be in communication with the Bit Line in order to allow it to discharge as charged through the Bit Line and the selected memory cell (depending on the threshold voltage of the selected memory cell). The signal CLK is raised to Vblx at time t2 and lowered back down to Vss at time T5 to prevent any fighting conditions in the circuit and to allow proper discharge of capacitor 916.

As discussed above, because H00 is raised between t0 and t1, capacitor 916 (and SEN node) will charge up between t0 and t1 (the pre-charge). This is depicted in FIG. 24 with the SEN node charging from Vss to either Vpre_LT or Vpre_HT. The solid line for Vpre_LT represents an example pre-charging of the node SEN at a lower temperature in response to Vh00_LT being applied to the gate of transistor 910. The dotted line Vpre_HT is one example of charging of the node SEN (and capacitor 916) in response to the signal Vh00 HT—at a higher temperature.

When X00 is raised up at t3, capacitor 916 can discharge through the Bit Line (if the threshold voltage is at the appropriate level). As depicted in FIG. 24 between t3 and t4, both Vpre_LT and Vpre_HT will discharge to the same level, Vpost_con. If the threshold voltage for the memory cell being tested is high enough, capacitor 916 will not discharge and the voltage will remain at Vpre_LT (indicated by—line Vpost_ nocon) or will remain at the level Vpre_HT (not depicted in FIG. 24).

FIG. 24 shows that the signal FCO is raised to Vdd at t7 and lowered to Vss at T9. The signal STRO is raised to Vdd at t8 and lowered at t9. Between times t8 and t9, there is a path between the inverters 930, 932 and transistor 914. If the voltage at the node SEN is greater than the threshold voltage of transistor 914, then there will be a path from the inverters 930, 932 to CLK and the data at the inverters 930, 932 will dissipate through the signal CLK and through the transistor 914. If the voltage at the node SEN is lower than threshold voltage of transistor 914 (e.g. if the capacitor discharged), then transistor 914 will turn off and the voltage stored by the inverters 930, 932 will not dissipate into CLK. FIG. 24 shows the voltage level at A at Vdd. If the voltage of the capacitor does not dissipate (e.g., due to not enough current flowing because the threshold voltage of the selected memory cell is greater than the voltage being tested for), then transistor 914 will remain on and the voltage at node A will remain dissipate to Vss (as depicted by the dashed line). If the voltage of the capacitor does dissipate (e.g., due to sufficient current flowing because the threshold voltage of the selected memory cell is below the voltage being tested for), then transistor 914 will turn off and the voltage at node A will remain at Vdd (as depicted by the solid line). The output of node A is provided to the Data Out signal via transistor 934 by applying Vdd to the signal NCO.

One embodiment includes a method of verifying programming of a non-volatile storage element, comprising testing whether the non-volatile storage element has at least a first threshold voltage by sensing whether the non-volatile storage element has less than a first current level while applying a first voltage level to a control gate of the non-volatile storage element and testing whether the non-volatile storage element has at least a second threshold voltage by sensing whether the non-volatile storage element has less than a second current level while applying the first voltage level to the control gate of the non-volatile storage element. The first current level is indicative of the first threshold voltage at a first temperature. The testing whether the non-volatile storage element has at least the first threshold voltage includes adjusting the first current level sensed for based on current temperature such that a difference between threshold voltages represented by the first current level and the second current level is constant over temperature variations.

One embodiment includes a plurality of non-volatile storage elements and one or more managing circuits in communication with the non-volatile storage elements to program and verify programming of the non-volatile storage elements. In order to verify programming, the one or more managing circuits test whether a non-volatile storage element has at least a first threshold voltage and test whether the non-volatile storage element has at least a second threshold voltage. The testing whether the non-volatile storage element has at least the first threshold voltage is performed by the one or more managing circuits by sensing whether the non-volatile storage element has less than a first current level while applying a first voltage level to a control gate of the non-volatile storage element. The first current level is indicative of the first threshold voltage at a first temperature. The testing whether the non-volatile storage element has at least the second threshold voltage is performed by the one or more managing circuits by sensing whether the non-volatile storage element has less than a second current level while applying the first voltage level to the control gate of the non-volatile storage element. The testing whether the non-volatile storage element has at least the first threshold voltage includes the one or more managing circuits adjusting the first current level sensed for based on current temperature such that a difference between threshold voltages represented by the first current level and the second current level is constant over temperature variations.

One embodiment includes providing programming to the non-volatile storage element; testing whether the non-volatile storage element has at least a first threshold voltage, including: pre-charging a charge storage device, determining a discharge time based on temperature, after the pre-charging, discharging the charge storage device through the non-volatile storage element for the discharge time, and sensing a voltage at the charge storage device after the discharge time, the sensed voltage being indicative of whether the non-volatile storage element has at least the first threshold voltage; and adjusting programming for the non-volatile storage element if the non-volatile storage element has at least the first threshold voltage.

One embodiment includes providing programming to the non-volatile storage element; testing whether the non-volatile storage element has at least a first threshold voltage, including: pre-charging a charge storage device to a magnitude based on current temperature, after the pre-charging, discharging the charge storage device through the non-volatile storage element for a period of time, and sensing a voltage at the charge storage device after the period of time, the sensed voltage being indicative of whether the non-volatile storage element has at least the first threshold voltage; and adjusting programming for the non-volatile storage element if the non-volatile storage element has at least the first threshold voltage.

One embodiment includes a non-volatile storage element, a bit line connected to the non-volatile storage element; and one or more managing circuits in communication with the non-volatile storage elements to program and verify programming of the non-volatile storage elements. The one or more managing circuits include a sensing circuit used to verify programming. The sensing circuit comprises: a charge storage device, a pre-charging path in communication with the capacitor in order to pre-charge the capacitor, the pre-charging path includes a first switch in the pre-charging path, a bit line communication switch that cuts off and connects the bit line to the capacitor so that the capacitor is capable of discharging the pre-charge through the bit line and the non-volatile storage element, a data source, a sensing switch that is connected to the capacitor and in communication with the data source such that if a voltage at the capacitor after attempting to discharge the pre-charge through the bit line is above a particular voltage then the sensing switch allows the data source to dissipate its data, and an adjustable voltage circuit that adjusts output voltage based on temperature. The adjustable voltage circuit is in communication with and provides its output voltage to the first switch in the pre-charging path such that the pre-charging of the capacitor is a function of temperature. The discharging or lack of discharging the data source is an indication of whether the non-volatile storage element has successfully completed programming.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method of verifying programming of a non-volatile storage element, comprising:

testing whether the non-volatile storage element has at least a first threshold voltage by sensing whether the non-volatile storage element has less than a first current level while applying a first voltage level to a control gate of the non-volatile storage element, the first current level is indicative of the first threshold voltage at a first temperature; and testing whether the non-volatile storage element has at least a second threshold voltage by sensing whether the non-volatile storage element has less than a second current level while applying the first voltage level to the control gate of the non-volatile storage element, the testing whether the non-volatile storage element has at least the first threshold voltage includes adjusting the first current level sensed for based on current temperature such that a difference between threshold voltages represented by the first current level and the second current level is constant over temperature variations.

2. The method of claim 1, wherein:
the testing whether the non-volatile storage element has at least the second threshold voltage includes adjusting the second current level sensed for based on current temperature.

3. The method of claim 1, wherein:
the adjusting the first current level sensed for based on current temperature includes adjusting a time period for sensing current through the non-volatile storage element based on current temperature.

4. The method of claim 1, wherein:
the sensing whether the non-volatile storage element has less than the first current level while applying the first voltage level to the control gate of the non-volatile storage element includes discharging a charge through the non-volatile storage element for a period of time; and
the adjusting the first current level sensed for based on current temperature includes adjusting the period of time for discharging the charge through the non-volatile storage element based on current temperature.

5. The method of claim 1, wherein:
the sensing whether the non-volatile storage element has less than the first current level while applying the first voltage level to the control gate of the non-volatile storage element includes pre-charging a charge storage device, subsequently discharging the charge storage device through the non-volatile storage element for a period of time and sensing the voltage at the charge storage device; and
the adjusting the first current level sensed for based on current temperature includes adjusting magnitude of the pre-charging of the charge storage device based on current temperature.

6. The method of claim 1, further comprising:
performing coarse programming for the non-volatile storage element; and
performing fine programming for the non-volatile storage element, testing whether the non-volatile storage element has at least the first threshold voltage is testing to determine whether coarse programming has completed, testing whether the non-volatile storage element has at least the second threshold voltage is testing to determine whether fine programming has completed.

7. The method of claim 1, wherein:
the second current level is not adjusted based on current temperature while testing whether the non-volatile storage element has at least the second threshold voltage.

8. The method of claim 1, wherein:
the sensing whether the non-volatile storage element has less than the first current level while applying the first voltage level to the control gate of the non-volatile storage element includes determining whether drain to source current of the non-volatile storage element is less than the first current level; and
the sensing whether the non-volatile storage element has less than the second current level while applying the first voltage level to the control gate of the non-volatile storage element includes determining whether drain to source current of the non-volatile storage element is less than the second current level;
the adjusting the first current level sensed for includes sensing current temperature and calculating a test parameter based on the sensed current temperature;
the non-volatile storage element is a NAND memory cell;
the testing whether the non-volatile storage element has at least the first threshold voltage and the testing whether the non-volatile storage element has at least the second threshold voltage are two sensing operations performed after applying a common programming pulse to the control gate of the non-volatile storage element;
if the non-volatile storage element has current that is less than the second current level while applying the first voltage level to the control gate of the non-volatile storage element then the non-volatile storage element has a threshold voltage greater than the second threshold voltage level;
if the non-volatile storage element has current that is less than the first current level while applying the first voltage level to the control gate of the non-volatile storage element then the non-volatile storage element has a threshold voltage greater than the first threshold voltage level;
the second threshold voltage level is greater than the first threshold voltage level;
the first current level is greater than the second current level;
if the non-volatile storage element has current that is less than the first current level and greater than the second current level while applying the first voltage level to the control gate of the non-volatile storage element then the non-volatile storage element has a threshold voltage between the first threshold voltage level and the second threshold voltage level; and
the testing whether the non-volatile storage element has at least the first threshold voltage and the testing whether the non-volatile storage element has at least the second threshold voltage are performed for the non-volatile storage element as part of programming to a common data state of a set of multiple data states.

9. A non-volatile storage system, comprising:
a plurality of non-volatile storage elements; and
one or more managing circuits in communication with the non-volatile storage elements to program and verify programming of the non-volatile storage elements, in order to verify programming, the one or more managing circuits test whether a non-volatile storage element has at least a first threshold voltage and test whether the non-volatile storage element has at least a second threshold voltage, the testing whether the non-volatile storage element has at least the first threshold voltage is performed by the one or more managing circuits by sensing whether the non-volatile storage element has less than a first current level while applying a first voltage level to a control gate of the non-volatile storage element, the first current level is indicative of the first threshold voltage at a first temperature, the testing whether the non-volatile storage element has at least the second threshold voltage is performed by the one or more managing circuits by sensing whether the non-volatile storage element has less than a second current level while applying the first voltage level to the control gate of the non-volatile storage element, the testing whether the non-volatile storage element has at least the first threshold voltage includes the one or more managing circuits adjusting the first current level sensed for based on current temperature such that a difference between threshold voltages represented by the first current level and the second current level is constant over temperature variations.

10. The non-volatile storage system of claim 9, wherein:
the testing whether the non-volatile storage element has at least the second threshold voltage includes the one or more managing circuits adjusting the second current level sensed for based on current temperature.

11. The non-volatile storage system of claim 9, wherein:
the one or more managing circuits adjust the first current level sensed for based on current temperature by adjusting a time period for sensing current through the non-volatile storage element based on current temperature.

12. The non-volatile storage system of claim 9, wherein:
the one or more managing circuits sense whether the non-volatile storage element has less than the first current level while applying the first voltage level to the control gate of the non-volatile storage element by discharging a charge through the non-volatile storage element for a period of time; and
the one or more managing circuits adjust the first current level sensed for based on current temperature by adjusting the period of time for discharging the charge through the non-volatile storage element based on current temperature.

13. The non-volatile storage system of claim 10, wherein:
the one or more managing circuits sense whether the non-volatile storage element has less than the first current level while applying the first voltage level to the control gate of the non-volatile storage element by pre-charging a charge storage device in the one or more managing circuits, subsequently discharging the charge storage device through the non-volatile storage element for a period of time and sensing voltage at the charge storage device; and
the one or more managing circuits adjust the first current level sensed for based on current temperature by adjusting magnitude of the pre-charging of the charge storage device based on current temperature.

14. The non-volatile storage system of claim 9, wherein the one or more managing circuits include a sensing circuit, the sensing circuit comprises:
a capacitor;
a pre-charging path in communication with the capacitor in order to pre-charge the capacitor, the pre-charging path includes a first transistor in the pre-charging path;
a bit line communication transistor that cuts off and connects the bit line to the capacitor so that the capacitor is capable of discharging the pre-charge through the bit line;
a data source;
a sensing transistor that is connected to the capacitor and in communication with the data source such that if a voltage at the capacitor after attempting to discharge the pre-charge through the bit line is above a threshold voltage of the sensing transistor then the sensing transistor allows the data source to dissipate its data; and
an adjustable voltage circuit that adjusts output voltage based on temperature, the adjustable voltage circuit is in communication with and provides its output voltage to the first transistor in the pre-charging path such that the pre-charging of the capacitor is a function of temperature, the discharging or lack of discharging the data source is an indication of whether the non-volatile storage element has less than the first current level while applying the first voltage level to the control gate of the non-volatile storage element.

15. The non-volatile storage system of claim 9, wherein:
the one or more managing circuits perform coarse programming and fine programming for the non-volatile storage element, the one or more managing circuits test whether the non-volatile storage element has at least the first threshold voltage to determine whether coarse programming has completed, the one or more managing circuits test whether the non-volatile storage element has at least the second threshold voltage to determine whether fine programming has completed.

16. The non-volatile storage system of claim 9, wherein:
the plurality of non-volatile storage elements are NAND flash memory cells;
the testing whether the non-volatile storage element has at least the first threshold voltage and the testing whether the non-volatile storage element has at least the second threshold voltage are two sensing operations performed after applying a common programming pulse to the control gate of the non-volatile storage element;
if the non-volatile storage element has current that is less than the second current level while applying the first voltage level to the control gate of the non-volatile storage element then the non-volatile storage element has a threshold voltage greater than the second threshold voltage level;
if the non-volatile storage element has current that is less than the first current level while applying the first voltage level to the control gate of the non-volatile storage element then the non-volatile storage element has a threshold voltage greater than the first threshold voltage level;
the second threshold voltage level is greater than the first threshold voltage level;
the first current level is greater than the second current level; and
if the non-volatile storage element has current that is less than the first current level and greater than the second current level while applying the first voltage level to the control gate of the non-volatile storage element then non-volatile storage element has a threshold voltage between the first threshold voltage level and the second threshold voltage level.

* * * * *